(12) United States Patent
Huet et al.

(10) Patent No.: US 8,143,886 B2
(45) Date of Patent: Mar. 27, 2012

(54) DEVICE TO TEST THE GOOD WORKING ORDER OF A MAGNETIC FIELD GENERATOR

(75) Inventors: Guillaume Huet, Bourges (FR); Michel Pezard, Saint Germain du Puy (FR)

(73) Assignee: Nexter Systems, Roanne (FR)

( * ) Notice: Subject to any disclaimer, the term of this patent is extended or adjusted under 35 U.S.C. 154(b) by 510 days.

(21) Appl. No.: 12/285,097

(22) Filed: Sep. 29, 2008

(65) Prior Publication Data
US 2009/0091319 A1 Apr. 9, 2009

(30) Foreign Application Priority Data
Oct. 8, 2007 (FR) .................................... 07 07024

(51) Int. Cl.
*G01R 33/00* (2006.01)
(52) U.S. Cl. ......... 324/258; 324/263; 324/260; 89/1.13; 102/402
(58) Field of Classification Search .................. 324/260, 324/263, 258; 89/1.13; 102/401, 402, 417
See application file for complete search history.

(56) References Cited

U.S. PATENT DOCUMENTS

| | | | | |
|---|---|---|---|---|
| 3,248,645 A | * | 4/1966 | Gilbert | 324/251 |
| 4,837,489 A | | 6/1989 | McFee | |
| 5,256,960 A | | 10/1993 | Novini | |
| 5,432,437 A | * | 7/1995 | Turner | 324/95 |
| 5,440,232 A | | 8/1995 | Scarzello et al. | |
| 5,773,974 A | | 6/1998 | Kraz | |
| 5,801,322 A | * | 9/1998 | Laine et al. | 102/401 |
| 6,486,664 B1 | | 11/2002 | Metodiev et al. | |
| 6,850,070 B2 | * | 2/2005 | McQueeney et al. | 324/388 |
| 7,437,986 B2 | * | 10/2008 | Fuss et al. | 89/1.13 |
| 7,525,308 B2 | * | 4/2009 | Tsukada et al. | 324/243 |
| 2003/0184288 A1 | * | 10/2003 | Bouvier et al. | 324/244 |

FOREIGN PATENT DOCUMENTS

| | | |
|---|---|---|
| DE | 197 01 753 A1 | 7/1998 |
| EP | 0 675 421 A1 | 10/1995 |
| FR | 2 779 529 | 12/1999 |

* cited by examiner

*Primary Examiner* — Patrick Assouad
*Assistant Examiner* — David M. Schindler
(74) *Attorney, Agent, or Firm* — Oliff & Berridge, PLC

(57) ABSTRACT

A device to test the good working order of a magnetic field generator, and namely a demining coil, such device comprising at least one evaluation means for the magnetic field coupled with at least one display means, device wherein said evaluation means comprise at least one wound coil able to be positioned so that the lines of the magnetic field pass through it, said wound coil linked to evaluation electronics powered by said wound coil itself.

14 Claims, 3 Drawing Sheets

DEVICE TO TEST THE GOOD WORKING ORDER OF A MAGNETIC FIELD GENERATOR

BACKGROUND OF THE INVENTION

1. Field of the Invention

The technical scope of the invention is that of devices enabling the functioning of a magnetic field generator to be tested.

The invention is more particularly adapted to testing coils used in demining systems.

2. Description of the Related Art

A test device is known by patent FR-2779529, which enables the intensity level of a variable magnetic field to be assessed.

This device comprises a magnetic field sensor coupled with an electronic signal processing circuit. The circuit makes a comparison between the detected signal and a set point. The comparison results are displayed on a monitor.

This device is well adapted to the mapping of magnetic fields at some distance from the generator and to ensuring a measurement of the level of the field (using means enabling the set point to be varied).

It is, however, far too complex to be used simply to validate or verify that a generator is functioning correctly. Furthermore, the sensor's sensitivity is maximal in a well-defined direction which must be known with respect to the generator to avoid an evaluation error.

There is thus a need for a cheap, robust test device enabling the validation of the good working order of a magnetic field generator to be reliably established.

SUMMARY OF THE INVENTION

The aim of the invention is to supply such a device.

Thus, the invention relates to a device to test the good working order of a magnetic field generator, and namely a demining coil, such device comprising at least one evaluation means for the magnetic field coupled with at least one display means, device wherein the evaluation means comprise at least one wound coil able to be positioned so that the lines of the magnetic field pass through it, such wound coil linked to evaluation electronics powered by the wound coil itself.

The evaluation electronics may comprise at least one calibrated circuit powering the display means.

According to another embodiment, the evaluation electronics may comprise at least two separate channels each enabling a different frequency of the magnetic field to be tested.

Each evaluation channel may associate a filtering stage and an evaluation stage.

The evaluation electronics may associate an evaluation stage configured for a frequency of around ten Hz or so and an evaluation channel configured for a frequency of over one kilo Hz.

Advantageously, the two evaluation channels will be coupled with the same display means.

The evaluation electronics may comprise an energy storage module incorporating at least one capacitor.

The display means may comprise at least one pilot lamp.

The display means may namely comprise a single pilot lamp arranged on an upper face of the device.

The wound coil will preferably be integral with a casing delimiting a bore intended to cap a generator to be tested.

BRIEF DESCRIPTION OF THE DRAWINGS

The invention will become more apparent from the following description of a particular embodiment, such description being made with reference to the appended drawings, in which.

DETAILED DESCRIPTION OF PREFERRED EMBODIMENTS

Figure 1:
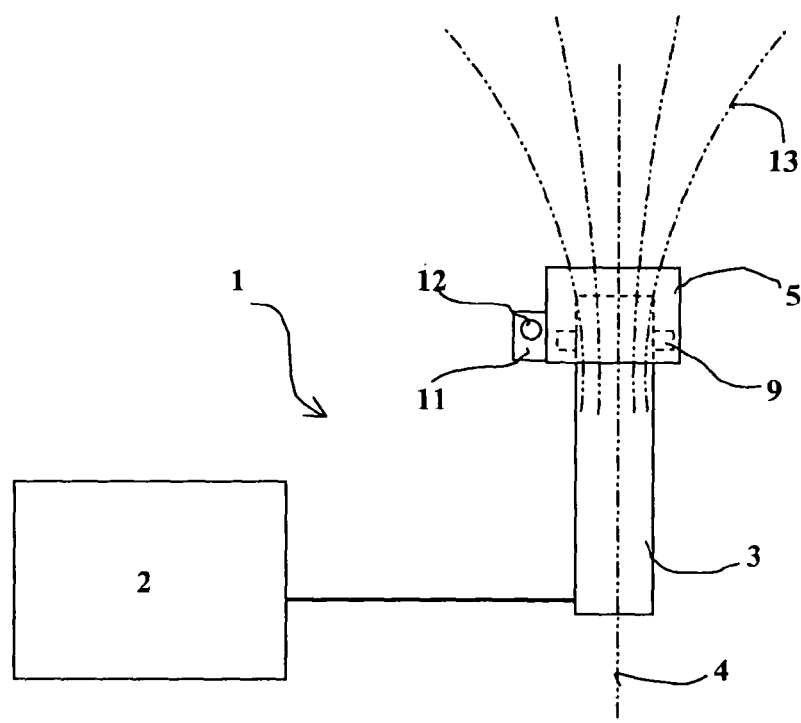
FIG. 1 is a diagram showing the device installed on a demining coil.

FIG. 1 schematically shows a demining device 1 comprising a power source 2 linked to a magnetic field generator 3 constituted by a cylindrical coil with axis 4 which is integral with a vehicle (not shown).

Such a demining device is disclosed by patent FR2750204 and thus does not require further description here.

The coil 3 is shown here capped by a test device 5 according to the invention.

Figure 2:
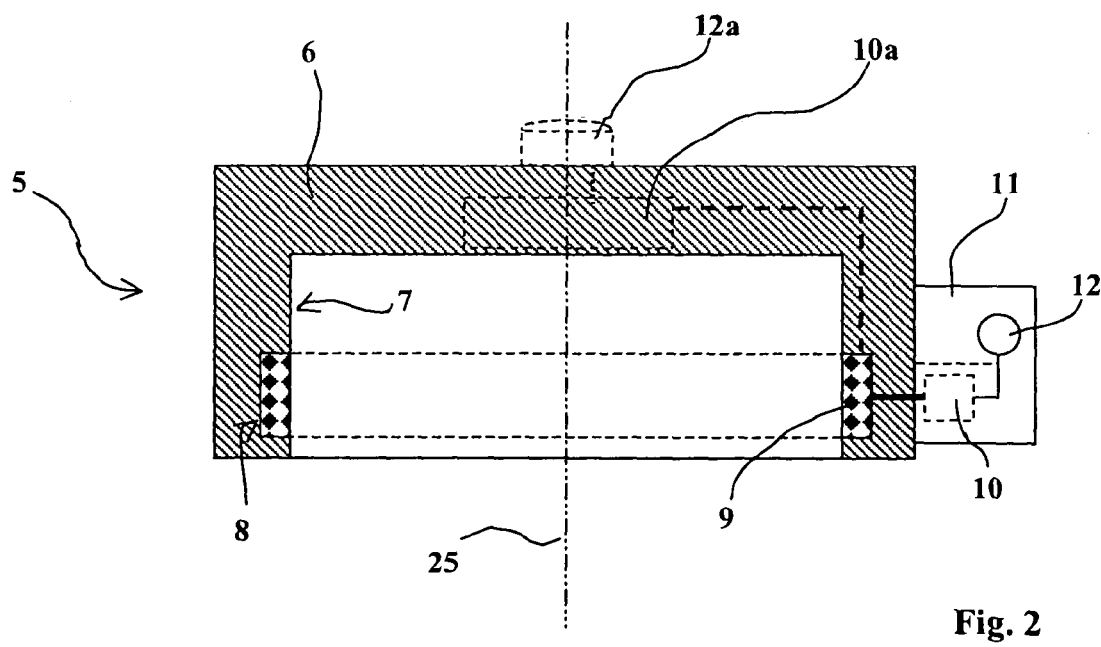
FIG. 2 is a section view of a device according to one embodiment of the invention.

FIG. 2 shows a section of one embodiment of this test device 5.

The latter comprises a casing 6 delimiting a cylindrical bore 7 with axis 25 intended to cap the coil 3 and which thus has a diameter substantially equal to the external diameter of the coil 3. The casing 6 incorporates a cylindrical notch 8 in which a conductor is wound to form a wound coil 9. The wound coil 9 may be made integral to the casing 6 by duplicate molding or by bonding.

The wound coil 9 is linked to measurement electronics 10 arranged in a case 11 integral with the casing 6. The measurement electronics 10 are linked to the display means 12 constituted by a pilot lamp. The wound coil 9 and measurement electronics 10 constitute the evaluation means for the magnetic field.

Figure 3:
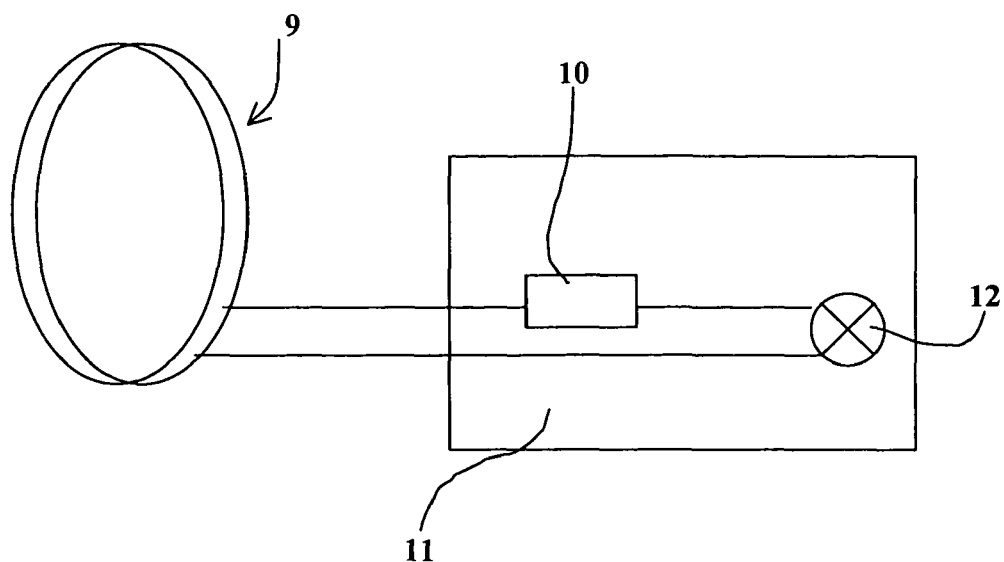
FIG. 3 is a diagram of one embodiment of the evaluation means of the device according to the invention.

FIG. 3 shows an embodiment of these evaluation means. The wound coil 9 is linked to the pilot lamp 12 by means of a circuit incorporating at least one calibrated resistor. The circuit thus formed does not comprise a power source. It is powered by the wound coil 9 when the lines of the field 13 (FIG. 1) generated by the generator 3 pass through it and when this field varies as a function of time.

The value of the calibrated resistor 10 is selected as a function of the level of the magnetic field, which is required to be tested.

For a given wound coil, the electromotive force of the coil is proportional to the intensity of the magnetic field and is furthermore proportional to the variation frequency of this field.

Someone skilled in the art will select the value of the resistor such that the pilot lamp 12 only lights up if the magnetic field presents the required characteristics from the perspective of intensity and frequency.

Furthermore the number of loops in the wound coil 9 will be selected so as to ensure (when the coil is coupled with one of the generators 3 to be tested) an induced current of sufficient intensity to enable the pilot lamp 12 to be lit.

The device according to the invention is thus particularly simple and robust. Furthermore, the pilot lamp is only able to light up in the presence of a variable magnetic field.

The device thus enables two types of fault to be highlighted: one in which the field is at an insufficient level and one in which the filed is continuous even if its level in absolute value is sufficient.

The good working order of the generator is indicated by the pilot lamp 12 periodically going on and off. The frequency of its being switched on corresponds to that of the magnetic field generated.

Different variants are possible without departing from the scope of the invention. It is possible for several pilot lamps 12 to be provided, oriented differently, this in order to make it easier for an operator at a distance to observe whether the device is in working order or not.

By way of example, a pilot lamp 12a is shown in FIG. 2 by dotted lines which is positioned on an upper face of the device 5 and which is connected to measurement electronics 10a embedded in the body of the device.

It is naturally possible to implement the invention using different measurement electronics. For example, a circuit comprising a band-pass filter and peak level detector may be employed, such circuit being designed to deliver a discontinuous signal which is an image of the peak-to-peak amplitude of the voltage generated by induction in the wound coil 9, thus also of the amplitude of the magnetic field received.

This signal may be directed to a comparator, which will receive a constant signal supplied by set point means. The comparator will control the lighting of the pilot lamp if the signal received is greater than or equal to the set point.

Once again, the supply of electrical energy for the measurement electronics will be ensured using the current induced by the magnetic field in the wound coil.

This type of embodiment will enable the device to be adapted to different types of generators by modifying the set point value.

Figure 4:
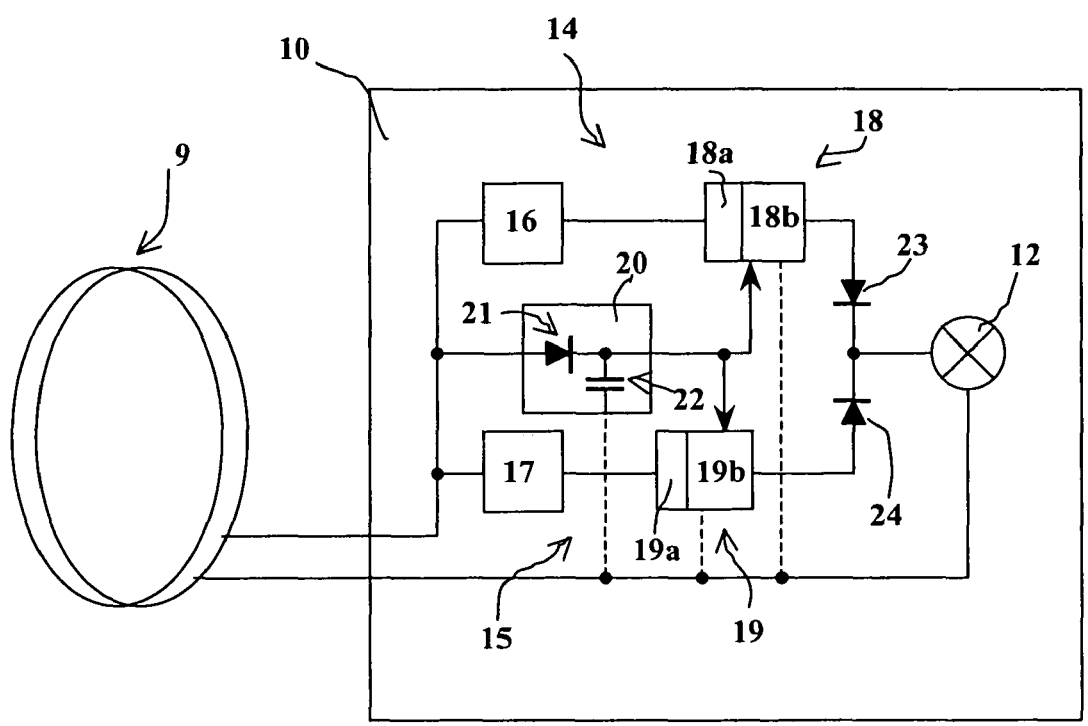
FIG. 4 is a diagram of a second embodiment of the evaluation means of the device according to the invention.

FIG. 4 shows a test device according to a second embodiment of the invention.

In this embodiment, the evaluation electronics 10 comprise two separate evaluation channels 14 and 15 each enabling a different frequency of the magnetic field to be tested.

Indeed, there are demining devices which function at different operating frequencies, for example, low frequency demining devices (frequencies of around ten Hertz or so) and high frequency demining devices (over a kilo Hertz). These devices functioning at high and low frequency may furthermore be associated in the same vehicle.

Each evaluation channel 14, 15 comprises a filtering stage 16, 17 followed by an evaluation stage 18, 19.

Each filtering stage 16, 17 is made classically by associating resistors and capacitors. They enable only that part of the signal supplied by the wound coil 9, which corresponds to the frequency intended to be evaluated by the channel, to pass through to the evaluator 18 or 19.

For example, the low frequency filtering stage 16 will be calibrated to let frequencies pass of around ten Hz or so and the high frequency filtering stage 17 will be defined so as to let frequencies pass which are over a kHz.

In parallel to the filtering stages 16, 17, the wound coil 9 supplies an energy storage module 20. This module associates, for example, a diode 21 and a capacitor 22.

The alternative current supplied by the coil 9 charges the capacitor 22.

The purpose of this module 20 is firstly to power the evaluators 18 and 19, and secondly to power the pilot lamp 12.

The evaluation modules 18 and 19 comprise a calibration stage 18a, 19a that enables only a fraction of the voltage from the filter 16, 17 to be retained. The detection sensitivity is thereby regulated for each evaluation channel. These calibration stages will classically comprise a rectifier followed by a resistor bridge.

The calibration stages 18a, 19a will be connected to an oscillator 18b, 19a (made in the form of integrated circuits). Each oscillator will be calibrated at a well defined frequency which will be different for the high frequency channel 15 and for the low frequency channel 14.

Thus, the calibration signals supplied by stages 18a, 19a will be applied at the "reset" input (RAZ) of each oscillator. This will result in a signal being emitted, or not, by the oscillator in question.

If a current of the required frequency is detected by one of the stages 14 or 15, the calibration stage in question (18a or 19a) will apply a voltage to the RAZ input of oscillator 18b or 19b. The latter is thereafter unlocked and periodically supplies a current to the pilot lamp 12 causing it to light up at the frequency which has been associated by adjustment to the oscillator 18b, 19b in question. If the stages 14 or 15 do not detect a current, the oscillators are locked and the pilot lamp 12 remains off. Diodes 23, 24 are positioned between each oscillator and the pilot lamp 12. The combination of these two diodes constitutes a logic gate OU. The pilot lamp 12 is thus lit up indifferently by one or other of the evaluation channels 14, 15.

Figure 5:
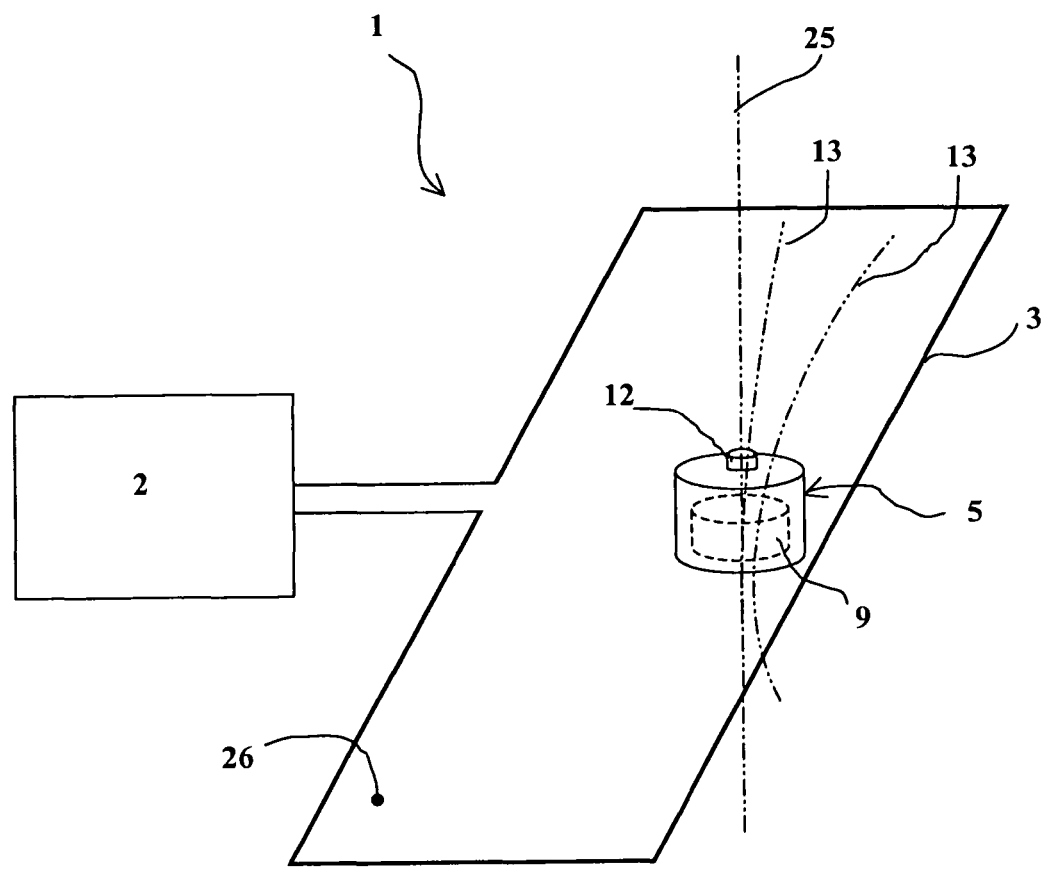
FIG. 5 is a diagram showing the installation of a device according to this later embodiment of the invention to test a demining coil functioning at high frequency.

FIG. 5 shows the test device 5 implemented to control a demining device 1 functioning at high frequency. This demining device also comprises a power source 2 connected to a magnetic field generator 3 constituted by one or several conductive loops, which will, for example, be integral with a mechanical organ integral with a vehicle, for example a demining plough. To control this magnetic field generator the test device 5 according to the invention is positioned close to the loop or one of the loops 3. The axis 25 of the test device 5 will be positioned substantially perpendicularly to the plane 26 of the loop (more often than not the axis 25 is thus substantially vertical). In such a position, the lines 13 of the magnetic field generated by the generator 3 pass through the wound coil 9 of the device 5, which is thus able to function.

The device 5 shown in FIG. 5 incorporates a single pilot lamp 12 arranged on an upper face of the device 5. This lamp is thus visible form all directions in space. A suitable optical device may be provided to ensure the diffusion of the radiation over 360°. We can thus see that the device according to this embodiment of the invention just as easily enables a low frequency demining device such as that shown in FIG. 1 to be tested as a high frequency device such as that shown in FIG. 5.

The device incorporates no onboard power source, no control buttons and no adjustment means. It is extremely robust and enables the presence of an alternative magnetic field of a given intensity to be verified (pilot lamp off in the absence of the field or if the field is continuous, of insufficient level or is not in the correct frequency band). It also enables generators to be tested that function according to different frequencies, and this with no particular adjustment or intervention required on the device.

Furthermore, a user, even an inexperienced one, will easily be able to detect the lighting frequencies of the lamp, which are different for high or low frequency generators.

What is claimed is:

1. A device to test good working order of a magnetic field generator that is configured to generate a magnetic field that varies at different frequencies, the device comprising:

evaluation electronics for the magnetic field;

at least one display means linked to the evaluation electronics;

at least one wound coil able to be positioned so that the magnetic field passes through the at least one wound coil;

a casing delimiting a bore configured to cap the magnetic field generator to be tested, the at least one wound coil being integral with the casing delimiting the bore, wherein said at least one wound coil is linked to the evaluation electronics, and the evaluation electronics are powered by electro-magnetic effects experienced by the at least one wound coil when the at least one wound coil is exposed to the magnetic field.

2. A test device according to claim 1, wherein said evaluation electronics comprise at least one calibrated circuit powering said at least one display means.

3. A test device according to claim 1, wherein said evaluation electronics comprise at least two separate evaluation channels each enabling a different frequency of the magnetic field to be tested.

4. A test device according to claim 3, wherein each of the evaluation channels is associated with a filtering stage and an evaluation stage.

5. A test device according to claim 3, wherein said evaluation electronics comprise a first evaluation channel of the at least two separate evaluation channels, the first evaluation channel being configured for a frequency of around ten Hz and a second evaluation channel of the at least two separate evaluation channels, the second evaluation channel being configured for a frequency of over one kilo Hz.

6. A test device according to claim 3, wherein said at least two separate evaluation channels are linked with a same one of the at least one display means.

7. A test device according to claim 5, wherein the first evaluation channel and the second evaluation channel are linked with a same one of the at least one display means.

8. A test device according to claim 1, wherein said evaluation electronics comprise an energy storage module incorporating at least one capacitor.

9. A test device according to claim 1, wherein said at least one display means comprise at least one pilot lamp.

10. A test device according to claim 8, wherein said at least one display means comprise a single pilot lamp arranged on an upper face of said device.

11. A test device according to claim 1, wherein the magnetic field generator is a demining coil.

12. A test device according to claim 1, wherein the bore has an inner side wall configured to receive the magnetic field generator within the bore, the at least one wound coil being embedded within and around the inner side wall to surround the magnetic field generator when the magnetic field generator is received within the bore.

13. A test device according to claim 12, wherein the inner side wall of the bore is cylindrically shaped.

14. A test device according to claim 1, wherein the evaluation electronics comprise at least an evaluation stage.

* * * * *